(12) United States Patent
Nairn

(10) Patent No.: US 7,053,804 B1
(45) Date of Patent: May 30, 2006

(54) PHASE-ERROR REDUCTION METHODS AND CONTROLLERS FOR TIME-INTERLEAVED ANALOG-TO-DIGITAL SYSTEMS

(75) Inventor: David G. Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/992,884

(22) Filed: Nov. 18, 2004

(51) Int. Cl.
*H03M 1/00* (2006.01)
*H03M 1/06* (2006.01)

(52) U.S. Cl. .................................... 341/118; 341/141
(58) Field of Classification Search ............... 341/118, 341/120, 141, 155, 143; 327/161, 94; 375/326; 326/35; 374/178; 370/321, 337
See application file for complete search history.

(56) References Cited

U.S. PATENT DOCUMENTS

| | | | | |
|---|---|---|---|---|
| 5,155,388 A * | 10/1992 | Corcoran et al. | ............ | 326/35 |
| 5,294,926 A * | 3/1994 | Corcoran | .................... | 341/120 |
| 5,982,821 A * | 11/1999 | Kingston et al. | ........... | 375/326 |
| 6,177,893 B1 | 1/2001 | Velazquez et al. | .......... | 341/118 |
| 6,335,647 B1 * | 1/2002 | Nagano | ........................ | 327/161 |
| 6,373,415 B1 * | 4/2002 | King et al. | ................. | 341/118 |
| 6,384,756 B1 * | 5/2002 | Tajiri et al. | ................. | 341/120 |
| 6,392,575 B1 | 5/2002 | Eklund | ........................ | 341/141 |
| 6,414,612 B1 * | 7/2002 | Quesenberry | ............... | 341/120 |
| 6,518,905 B1 * | 2/2003 | Siferd | ......................... | 341/143 |
| 6,522,282 B1 * | 2/2003 | Elbornsson | ................. | 341/155 |
| 6,538,592 B1 * | 3/2003 | Yang et al. | ................. | 341/155 |
| 6,570,410 B1 | 5/2003 | Manganaro | ................... | 327/94 |
| 6,600,438 B1 * | 7/2003 | Hilton | ........................ | 341/155 |
| 6,700,515 B1 * | 3/2004 | Asami | ........................ | 341/120 |
| 6,808,307 B1 * | 10/2004 | Aslan et al. | ................. | 374/178 |
| 6,836,235 B1 * | 12/2004 | Asami | ........................ | 341/155 |
| 6,900,750 B1 * | 5/2005 | Nairn | ......................... | 341/118 |
| 6,943,714 B1 * | 9/2005 | White | ........................ | 341/141 |
| 6,982,664 B1 * | 1/2006 | Nairn | ......................... | 341/118 |

OTHER PUBLICATIONS

Looney, Mark, "Advanced Digital Post-Processing Techniques Enhance Performance in Time-Interleaved ADC Systems", Analog Dialogue 37-8, Aug., 2003, pp. 1-5, no date.
Elbornsson, J., "Blind Estimation of Timing Errors in Interleaved AD Converters", Dept. of Electrical Engineering, Linkopings Universitet, Linkoping, Sweden, May, 2001, 4 pages, no date.
Sin, Sai-Weng, et al., "Timing-Mismatch Analysis in High-Speed Analog Front-End with Nonuniformly Holding Output", Faculty of Science and Technology, University of Macau, Macau, China, May 2003, 4 pages, no date.

* cited by examiner

*Primary Examiner*—Patrick Wamsley
(74) *Attorney, Agent, or Firm*—Koppel, Patrick & Heybl

(57) ABSTRACT

Methods and controllers are provided to estimate and reduce phase errors between converters of time-interleaved analog-to-digital systems by generating corresponding error signals in the form of difference signals. The difference signals concern differences between magnitudes of first adjacent samples and interleaved second adjacent samples of the converters. The difference signals can be applied (e.g., to a converter's input sampler or to a variable delay element inserted after the converter) to substantially reduce the phase errors. The methods and controllers may be economically implemented because they can be realized with simple operations (e.g., addition and subtraction). Although some embodiments are facilitated with knowledge of parameters of the analog input signal, others do not require this knowledge so long as the signal is restricted to lie within a single Nyquist zone.

16 Claims, 5 Drawing Sheets

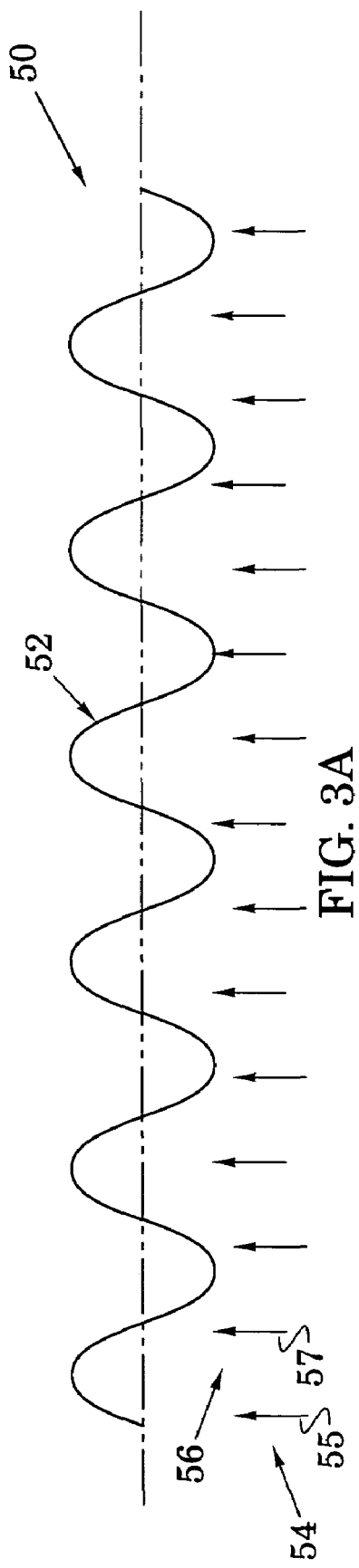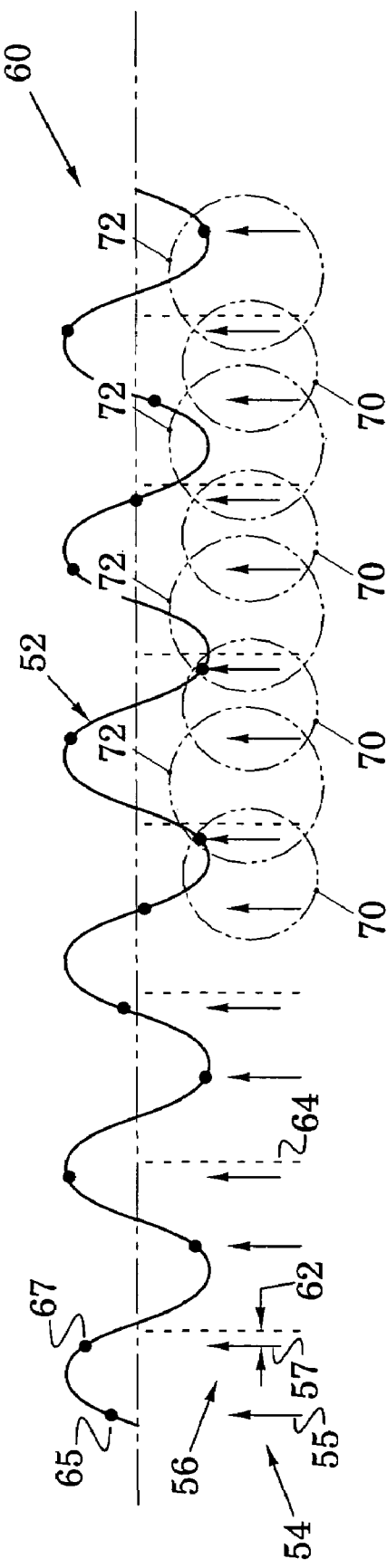

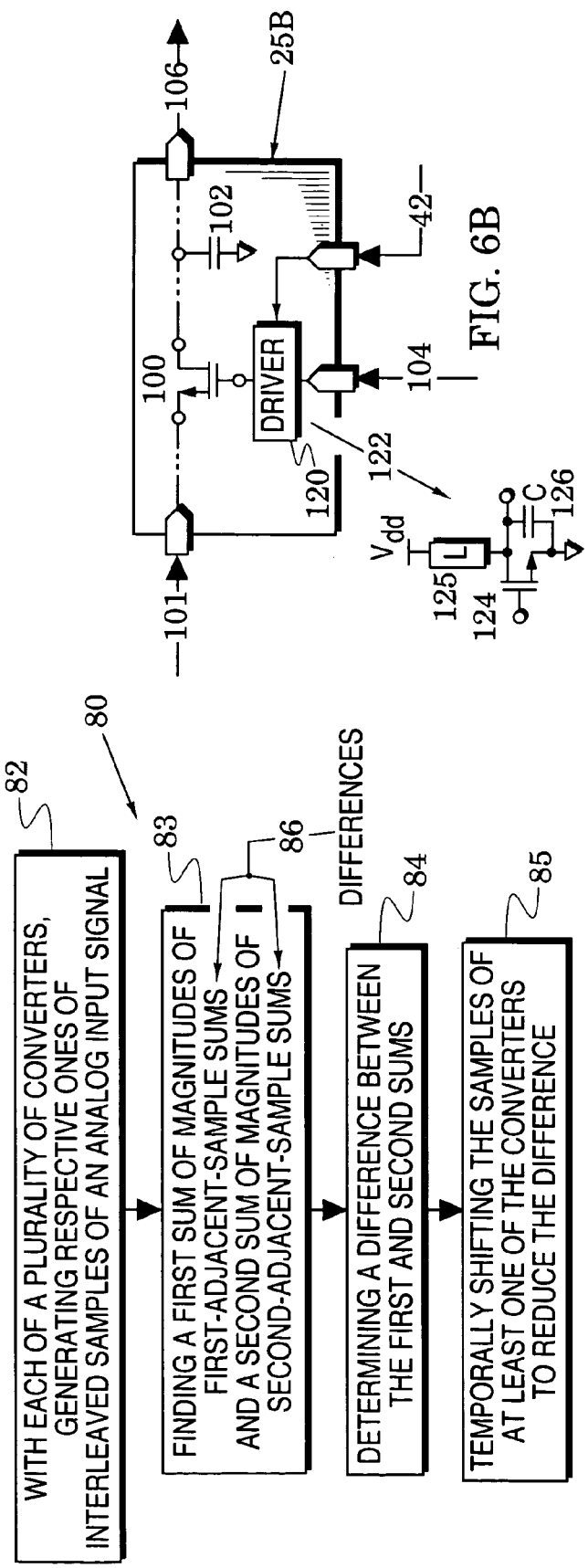
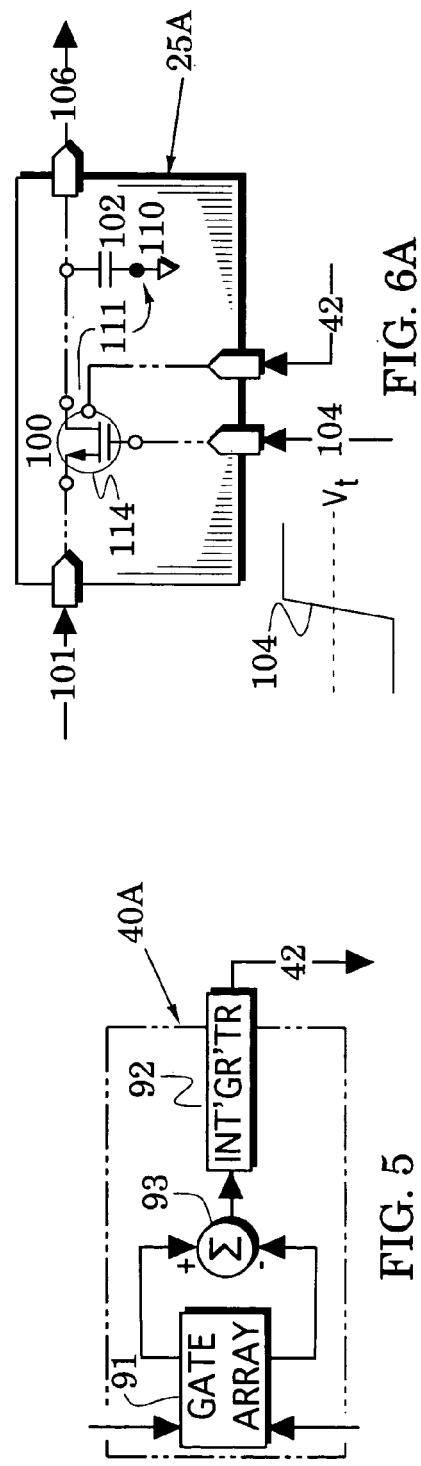

PHASE-ERROR REDUCTION METHODS AND CONTROLLERS FOR TIME-INTERLEAVED ANALOG-TO-DIGITAL SYSTEMS

BACKGROUND OF THE INVENTION

1. Field of the Invention

The present invention relates generally to time-interleaved converter systems.

2. Description of the Related Art

Time-interleaving a system of analog-to-digital converters offers system sample rates greater than those realized by any one of the individual converters. If the converters can sample and convert signals at a converter rate $f_c$, for example, then N time-interleaved converters can realize a system rate $f_s=Nf_c$.

Unfortunately, time-interleaved systems are sensitive to errors in the converter's clock phases. Because the system is unaware of the errors and assumes they were correct, the converters' samples are temporally displaced which introduces signal-dependent spurious tones that significantly degrade the system's performance. These phase errors (sometimes referred to as timing skews) are generally unknown and may drift with passage of time. Accordingly, high-resolution, time-interleaved systems often employ detection (or estimation) and correction techniques for phase-error reduction.

These techniques include a) the insertion of a calibration signal into the system's analog input signal, b) the assumption of input signal characteristics, and c) the use of signal processing techniques to estimate the phase error without advance knowledge of the input signal. Typically, the first approach significantly reduces the allowable signal range at the system's input. The second approach requires advance knowledge of the input signal's characteristics and is accordingly limited in its applications. The third approach generally requires the use of digital multipliers that run at the rate of the system's converters. In systems with high resolutions (e.g., 10 bits or more) and high sampling rates (e.g., above 200 megasamples per second (MSPS)), this requires significant semiconductor die area and excessive power dissipation.

BRIEF SUMMARY OF THE INVENTION

The present invention is directed to phase-error reduction in time-interleaved analog-to-digital systems. The novel features of the invention are set forth with particularity in the appended claims. The invention will be best understood from the following description when read in conjunction with the accompanying drawings.

BRIEF DESCRIPTION OF THE DRAWINGS

FIGS. 3A and 3B are graphs that illustrate operational concepts in the systems of FIGS. 1 and 2;

FIG. 4 is a flow chart that illustrates operational process embodiments in the systems of FIGS. 1 and 2;

FIG. 5 is a block diagram of another controller embodiment in the systems of FIGS. 1 and 2;

FIGS. 6A and 6B are schematics of sampler embodiments in the systems of FIGS. 1 and 2;

DETAILED DESCRIPTION OF THE INVENTION

FIGS. 1–7B illustrate methods and controllers for reducing phase errors in time-interleaved analog-to-digital systems. The methods and controllers provide simple techniques for estimating phase errors and generating corresponding error signals in the form of difference signals. The difference signals concern differences between magnitudes of first-adjacent-sample sums and interleaved second-adjacent-sample sums of the converters. The difference signals can be applied (e.g., to a converter's input sampler or to a variable delay element inserted after the converter) to substantially reduce the phase errors.

The methods and controllers may be economically implemented because they can be realized with simple operations (e.g., addition and subtraction). Although some embodiments are facilitated with knowledge of parameters of the analog input signal, others do not require this knowledge so long as the signal is restricted to lie within a single Nyquist zone.

Figure 1:
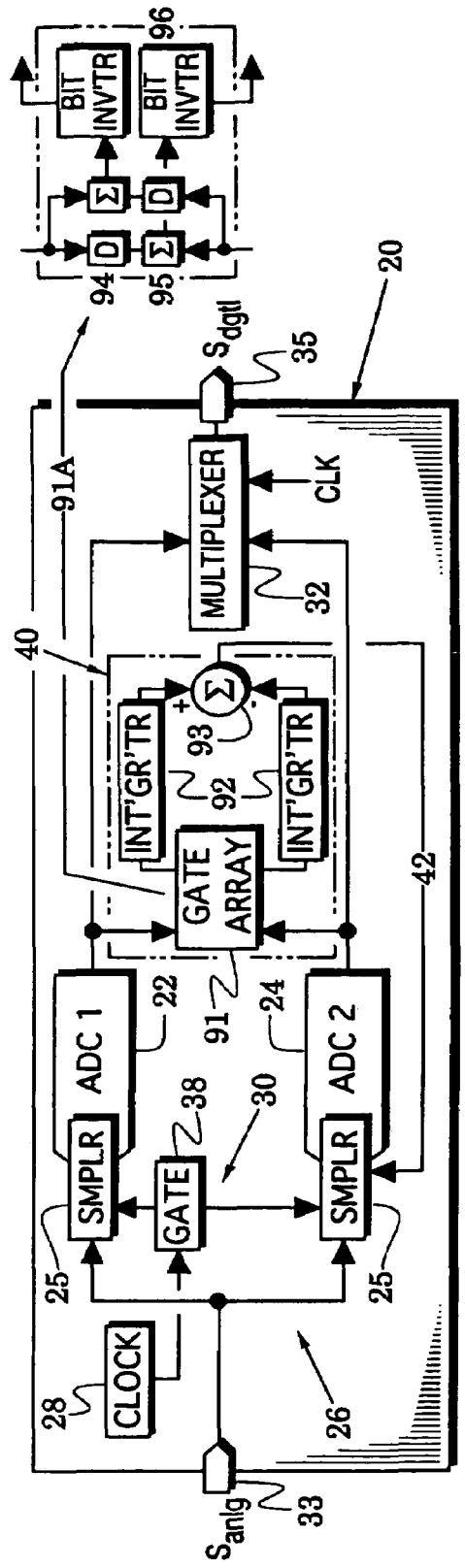
FIG. 1 is a block diagram of a time-interleaved converter system embodiment of the present invention.

In particular, FIG. 1 illustrates a converter system 20 of the present invention which includes at least two analog-to-digital converters 22 and 24 that each have an input sampler 25, an input signal distribution path 26, a clock 28, a clock distribution path 30, and a multiplexer 32. The input signal distribution path couples analog input signals $S_{anlg}$ at an input port 33 to each of the samplers 25.

The output signals from the converters 22 and 24 are coupled to the multiplexer 32 and the output of the multiplexer delivers a corresponding digital output signal $S_{dgtl}$ to an output port 35. The clock 28 sends the clock signal to the samplers 25 over the clock distribution path 30. The clock signal comprises interleaved clock phases and the path 30 includes at least one steering gate 38 which directs each phase to a respective one of the converters 22 and 24.

In operation of the system 20, the analog input signal $S_{anlg}$ is coupled over the signal distribution path to each of the converters. The sampler 25 of each converter responds to its respective clock phase by providing analog samples to the remainder of the converter for processing into digital samples that are provided to the multiplexer 32. The clock signal CLK (or a version of it) is also provided to the multiplexer which uses it to interleavably direct the digital samples to the output port 35 where they appear at the system rate $f_s$.

Figure 2:
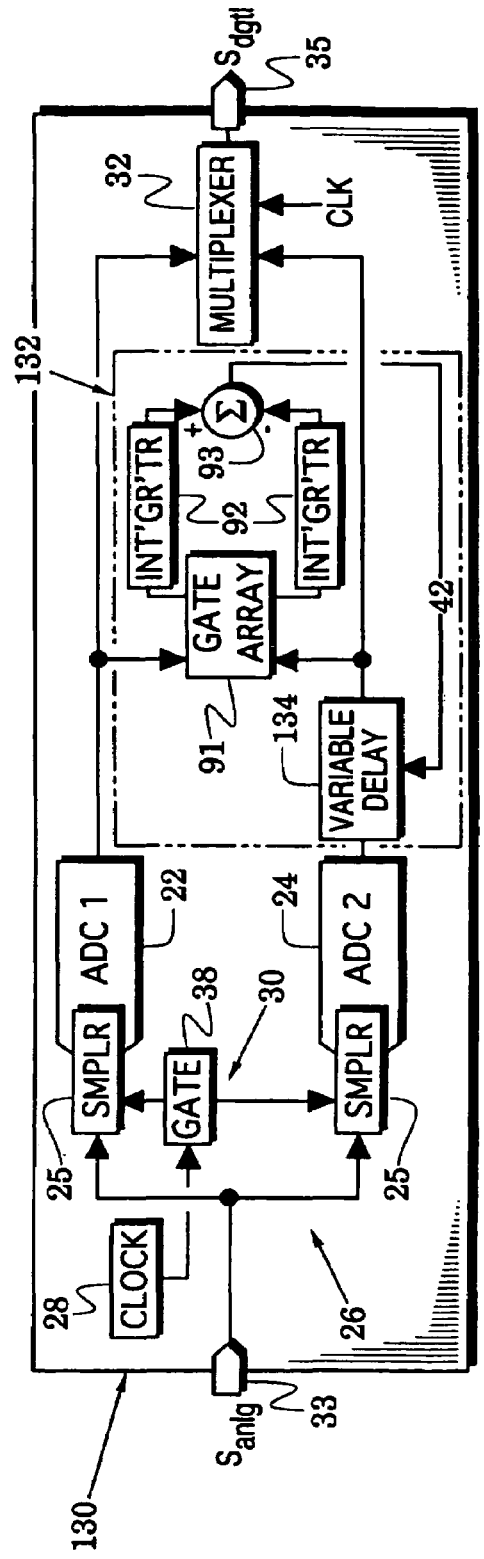
FIG. 2 is a block diagram of another time-interleaved converter system embodiment.

FIG. 2 illustrates another time-interleaved system 130 which is similar to the system 20 with like elements indicated by like reference numbers. The system 130 will be described subsequent to the following description of operation of the system 20.

At this point it is noted that the word "samples" was used above to refer to the discrete signals that are produced by the sampling processes of the samplers as well as the quantized signals that are produced by the converter processes of the remainder of the converter. Where necessary, the samples will be referred to as "analog samples" when referring to the discrete outputs of the samplers and "digitized samples" when referring to the outputs of the converters.

The time-interleaved system 20 of FIG. 1 can process samples of the input signal at a system rate $f_s$ while each converter 25 (and its sampler 32) process-respective input signals at a converter rate $f_c=f_s/N$ wherein N is the number of converters. Accordingly, the system can process signals at rates that the converters cannot realize on their own. Ideally, each converter 25 processes respective signal samples that have been obtained from the analog input signal $S_{anlg}$ at exact predetermined sample times that correspond to that converter's respective clock phase.

However, the input signal $S_{anlg}$ and the clock signal CLK have to be carried to each sampler 25 over the distribution paths 26 and 30. If the time delays through the clock distribution paths are not equal, the analog input signal will not be sampled at the predetermined sample times. Similarly, if the time delays through the signal distribution paths are not equal, the analog input signal will not be sampled at the predetermined sample times. In practice, it is extremely difficult to insure that the delay times through the distribution paths are all equal.

Accordingly, the system 20 provides a controller 40 in FIG. 1 which receives digitized samples from the converters 22 and 24 and, in response, temporally shifts signals (either analog samples or digitized samples) of at least one of the converters to reduce a difference between magnitudes of first-adjacent-sample sums and interleaved second-adjacent-sample sums. In particular, embodiments of the invention recognize that this difference provides a measure of the direction and magnitude of a phase error between the samples of one of the converters and another of the converters.

This becomes evident in graphs 50 and 60 of FIGS. 3A and 3B which illustrate interleaved sampling of an analog input signal that takes the form of a sinusoid 52. The clock 28 of FIG. 1 generates clock pulses at a rate $f_s$ as indicated by all of the vertically-directed arrows in the figure. Gate systems (e.g., the gate 38 of FIG. 1) direct a first phase 54 of clock signals 55 to the converter 22 of FIG. 1 and a second phase 56 of clock signals 57 to the converter 24 of FIG. 1 (the phases 54 and 56 are vertically offset to enhance visual clarity). The clock signals of each phase occur at a Nyquist rate of $f_N=f_s/2$ and it is apparent that the frequency of the sinusoid 52 has been chosen to place it in the first Nyquist zone (i.e., its frequency is somewhat less than the Nyquist rate $f_N$).

In FIG. 3A, it is assumed there are no timing errors so that each of the clock signals 57 lie exactly halfway between a corresponding pair of clock signals 55. In contrast, the clock signals 57 have been shifted by a phase error 62 in FIG. 3B so that they are spaced leftward from vertical broken lines 64 which indicate the intended positions of the clock signals 57 (their positions in FIG. 3A). Each of the clock signals 57 has thus moved closer to one of its adjacent clock signals 55 and further from the other of its adjacent clock signals 55.

FIG. 3B also has a plurality of sample dots which are each positioned on the sinusoid 52 directly above one of the clock signals 55 and 57. The sample dots corresponding to the clock signals 55 represent first samples 65 provided by the sampler of the converter 22 of FIG. 1 and the dots corresponding to the clock signals 57 represent second samples 67 provided by the sampler of the converter 24.

It is noted that the phase error 62 has caused each second sample 67 to move closer to one of its adjacent first samples 65 and these adjacent samples form first adjacent samples 70 (indicated in FIG. 3B by surrounding broken-line circles 70). In contrast, the phase error 62 has caused each second sample 67 to move further from the other of its adjacent first samples 65 and these adjacent samples form second adjacent samples 72 (indicated in FIG. 3B by surrounding broken-line circles 72). The first adjacent samples 70 are thus interleaved with the second adjacent samples 72 (with each second adjacent sample 72 sharing a sample with each of its neighboring first adjacent samples 70). To avoid visual distractions, the broken-line circles surround the clock signal arrows that correspond to the samples and not necessarily the samples themselves.

Converter embodiments of the invention are directed to the difference between magnitudes of first-adjacent-sample sums and second-adjacent-sample sums. These embodiments recognize that the first adjacent samples of FIG. 3B will tend to interfere constructively and to a greater degree than do the second adjacent samples so that the magnitudes of the first-adjacent-sample sums will tend to increase more rapidly than the magnitudes of the second-adjacent-samples sums. Although signs of the samples are considered when forming the first-adjacent-sample sums and second-adjacent-sample sums, only magnitudes are subsequently considered (i.e., the signs of the sums are ignored) because magnitudes of the first-adjacent-sample sums and second-adjacent-sample sums indicate the constructive interference.

Although FIG. 3B does not show a large number of first and second adjacent samples 70 and 72, this tendency begins to become apparent. For example, it is noted that sums of two of the four indicated first adjacent samples 70 of FIG. 3 (first and third from the left) will have magnitudes greater than the magnitudes of their individual samples while the sum of only one of the four indicated second adjacent samples 72 (third from the left) will have a magnitude greater than the magnitudes of its individual samples.

Accordingly, FIG. 4 shows a flow chart 80 that is directed to a method embodiment which begins with a first process 82 that generates, with each of a plurality of converters (the converters of FIG. 1, for example), respective ones of interleaved samples of an analog input signal. A process 83 then finds a first sum of magnitudes of first-adjacent-sample sums and a second sum of magnitudes of second-adjacent-sample sums. In a process 84, a difference between the first and second sums is determined. Finally, the samples of at least one of the converters are temporally shifted in process 85 to reduce the difference. As stated above, this difference provides a measure of the direction and magnitude of a phase error between the samples of one of the converters of a time-interleaved system and another of the converters of that system.

The controller 40 of FIG. 1 includes an array of gates 91, integrators 92 (abbreviated int'gr'tr) and an adder 93. As indicated by example arrow 91A, the gate array 91 may be configured to include delay elements 94 (e.g., D-type flip-flops) that temporally align samples of the first and second adjacent samples (70 and 72 in FIG. 3B) and include adders 95 that then find the first-adjacent-sample sums and second-adjacent-sample sums of process 83 of FIG. 4. Preferably, the array of gates 91 is further configured to provide magnitude-deriving structures (e.g., arrangements of bit inverters and adders) that form magnitudes of the first-adjacent-sample sums and second-adjacent-sample sums as also recited in process 83 of FIG. 4. If the digital samples are generated with signed magnitude, for example, the array would simply invert the most significant bit of negative sums with bit inverters 96 and, for one's complement numbers, complement every bit of negative sums.

The integrators 92 are configured to accumulate the magnitudes of the first-adjacent-sample sums and second-adjacent-sample sums over selected time periods to thereby provide the first and second sums as recited in process 83 of FIG. 4. Different accumulating embodiments may be realized with various integration structures such as digital filters (e.g., finite impulse response (FIR) filters) and accumulators. The first and second sums are then differenced in the adder 93 to realize the difference that is recited in process 84 of FIG. 4 (and which is shown as the difference 42 in FIG. 1). Although the integrators can be eliminated in other controller embodiments, they are preferably included to enhance the difference between magnitudes of the first-adjacent-sample sums and second-adjacent-sample sums which may be quite small when a small number of first and second adjacent samples is considered.

FIG. 5 shows another controller embodiment 40A which includes elements of the controller 40 with like elements indicated by like reference numbers. In contrast, the controller 40A is structured to exchange the integration and differencing functions in process 83 of FIG. 4. In particular, the adder 93 is moved between the gate array 91 and one of the integrators 92 of FIG. 4. In this embodiment, the adder 93 provides differences between magnitudes of first-adjacent-sample sums and magnitudes of second-adjacent-sample sums. The final integrator 92 then provides the difference 42 of FIGS. 1 and 2 as a sum of these differences.

Other system embodiments of the invention are directed to first-adjacent-sample differences which are the differences of the samples of the first adjacent samples 70 of FIG. 3B and to second-adjacent-sample differences which are the differences of the samples of the second adjacent samples 72. These differences can be processed similarly to the sums recited in the flow chart of FIG. 4 to obtain the difference 42 of FIG. 1. In these system embodiments, the gate array 91 of FIG. 1 is slightly altered to obtain first-adjacent-sample differences and second-adjacent-sample differences rather than first-adjacent-sample sums and second-adjacent-sample sums. These embodiments are indicated in the flow chart 80 of FIG. 4 by the substitution of "differences" for "sums" as indicate by the substitution arrow 86.

The difference signal 42 of FIG. 1 may be used in various system embodiments to alter the timing of the samples of one of the converters. FIG. 6A, for example, illustrates an embodiment 25A of one of the samplers 25 of FIG. 1. In the sampler 25A, a metal-oxide-semiconductor (MOS) transistor 100 is coupled as a switch that can be momentarily turned on to pass a sample of the analog input signal 101 (that has been coupled over the signal distribution path 26 of FIG. 1 from the input port 33) for storage in a capacitor 102.

In absence of a clock signal 104 (coupled over the clock distribution path 30 of FIG. 1), the transistor is turned off and the sample charge in the capacitor 102 is transferred out of the sampler as a sample signal 106 (various transfer circuitry can be used) which is then converted by the remainder of the converter (e.g., 24 in FIG. 1). The capacitor is then ready to receive a subsequent sample (other sampler structures may first remove the existing sample from the capacitor).

Various other sampler embodiments may be used. In different embodiments, for example, the switch transistor 100 may be positioned on the downstream side 110 of the capacitor as indicated by the position arrow 111, the transistor 100 may be accompanied by another switch transistor that is positioned on the downstream side 110, and the sample signal 106 may be taken from the downstream side 110 of the capacitor 102. Therefore, the following discussion applies to sampling switch transistors in general.

The switch transistor 100 is fabricated to lie in a semiconductor well 114 and is momentarily switched on by applying the clock signal 104 to its gate. As indicated by a timing plot of FIG. 6A, the transistor 100 switches when the clock signal 104 exceeds the transistor's threshold voltage $V_t$ which can be varied by varying the potential of the transistor well 114. Because the clock signal 104 can be configured to have a sloping edge, the transistor's switching time is now a function of the difference signal 42. The difference signal thus adjusts the timing of the samples taken by the sampler 25A and it will adjust this timing to reduce the phase error 62 of FIG. 3B.

FIG. 6B illustrates another embodiment 25B of the samplers 25 of FIG. 1. The sampler 25B includes the pass transistor 100 and capacitor 102 of FIG. 6A and adds a clock driver 120 that passes the clock signal 104 to the gate of the pass transistor. As indicated by an arrow 122 that indicates a driver embodiment, the clock signal generally passes through at least one driver transistor 124 which has a control terminal (e.g., a gate) responsive to the clock signal 104 and a current terminal (e.g., a drain) that is coupled to a supply voltage (e.g., Vdd) through a load (L) 125 (e.g., a resistor or an active load). A capacitance (C) 126 may also be coupled to the current terminal. Because the response time of the driver 120 is a function of a) impedance of the load L, b) the capacitance C, c) the supply voltage, and the driver's threshold voltage $V_t$, the response of the driver can be altered by changing any of these driver parameters with the difference signal 42.

In at least one embodiment of the time-interleaved system 20 of FIG. 1, it is anticipated that a timing adjustment range on the order of 10 picoseconds will be sufficient to correct the converter sampling errors. Because the transition time in an exemplary MOS fabrication process is on the order of 50 picoseconds, the required correction of sampling errors can be realized as shown in FIG. 6A in which the response time of the pass transistor 110 is altered or as shown in FIG. 6B in which the transition time of the driver 120 is altered. It is noted that the clock driver 120 may be located in various system elements (e.g., in a sampler or in its respective portion of the clock distribution network 30). It is further noted that the difference signal 42 may be modified as required to drive specific circuits (e.g., the transistor well 114 of FIG. 6A and the driver 120 of FIG. 6B.

Attention is now directed to the converter system 130 of FIG. 2 in which the controller 40 of FIG. 1 is modified to a controller 132 by the addition of a variable delay 134 which is positioned between the converter 24 and the multiplexer 32. The delay 134 generates a delay proportional to the difference signal 42 and may be realized with various delay structures such as fractional-delay filters (e.g., linear-phase filters that provide weighted sums). In the system 130, the difference signal 42 alters the signal delay through the variable delay 134 to thereby reduce the phase error 62 of FIG. 3B. It may be desirable to position a fixed delay element in the output of the converter 22 to match the basic delay of the variable delay 134.

An understanding of the methods and systems described above may be enhanced with mathematical expressions which are believed to represent system operations. Consider that the converters 22 and 24 of FIG. 1 are respectively associated with even samples (denoted by a subscript e) and odd samples (denoted by a subscript o) and that $\Delta T$ represents ½ of the total phase error between the even samples and the odd samples. If the converter 20 of FIG. 1 has a clock or system rate $f_s$, and the analog input signal is a cosine function with an amplitude $V_a$ and a rate $\omega_a$, then it can be shown that the average of the magnitude of sums of the first adjacent samples 70 of FIG. 3B is $$|\overline{v_{e+o}}| = \left|\frac{4V_a}{\pi}\cos\left(\omega_a\left(\frac{1}{2f_s} - \Delta T\right)\right)\right| \quad (1)$$

and the average of the magnitude of sums of the second adjacent samples 72 of FIG. 3B is $$|\overline{v_{o+e}}| = \left|\frac{4V_a}{\pi}\cos\left(\omega_a\left(\frac{1}{2f_s} + \Delta T\right)\right)\right|. \quad (2)$$

These expressions correspond to the first and second sums recited in process 83 of FIG. 4 and it is desired to determine the difference (42 in FIG. 1) between these sums as expressed in process 84. From equations (1) and (2), it may be shown that the difference is $$|\overline{v_{e+o}}| - |\overline{v_{o+e}}| = \frac{8V_a}{\pi}\sin\left(\frac{\omega_a}{2f_s}\right)\sin(\omega_a\Delta T) \quad (3)$$

in a lower portion of the first Nyquist zone and $$|\overline{v_{e+o}}| - |\overline{v_{o+e}}| = \frac{8V_a}{\pi}\cos\left(\frac{\omega_a}{2f_s}\right)\cos(\omega_a\Delta T) \quad (4)$$

in an upper portion of the first Nyquist zone.

Figure 7B:
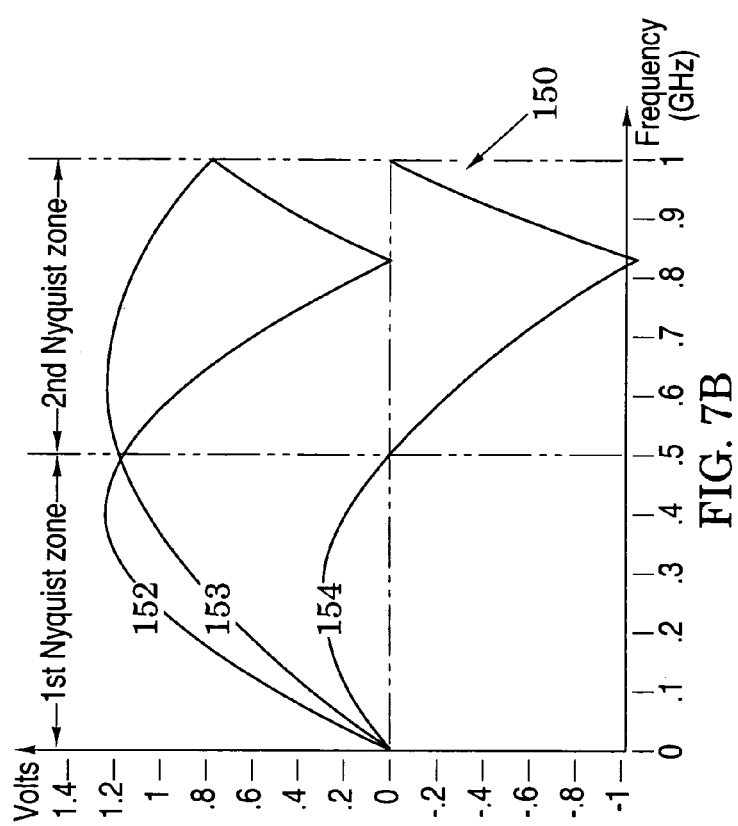
FIGS. 7A and 7B are graphs that illustrate generation of difference signals in the systems of FIGS. 1 and 2.
Figure 7A:
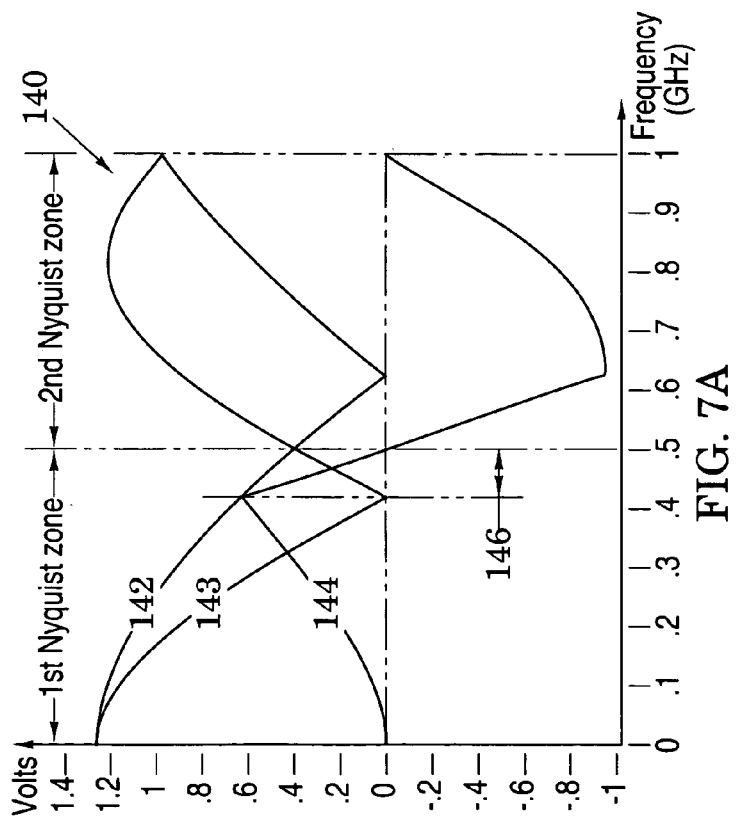

Equations (1) and (2) are shown as plots 142 and 143 in the graph 140 of FIG. 7A. Equations (3) and (4) are shown as the plot 144 wherein equation (4) applies to the upper portion 146 in FIG. 7A and equation (3) applies below that portion. Plot 144 thus represents the difference signal 42 of FIGS. 1 and 2. It is assumed in FIG. 7A that the system rate $f_s$ is 1 GHz and that $\Delta T$ is 100 picoseconds.

It is noted that the difference signal remains positive throughout the first Nyquist zone (0–0.5 GHz) and remains negative throughout the second Nyquist zone (0.5–1 GHz) so that the controllers of FIGS. 1 and 2 can also be used in other Nyquist zones when the zone of operation is known. As $\Delta T$ reduces below 100 picoseconds, the extent of upper portion 146 reduces so that the difference signal (42 in FIGS. 1 and 2) is defined by equation (3) throughout most of the first Nyquist zone.

FIG. 7A indicates that the difference plot 144 decreases as the frequency of the analog input signal decreases. Because signals in the lower portion of the first Nyquist zone are often of considerable interest, it would be useful if another source of the difference signal had a greater amplitude in this lower portion. This indeed is the case when the first-adjacent-sample differences and second-adjacent-sample differences are substituted as indicated by the substitution arrow 86 of FIG. 4.

Directing attention to this substitution, it can be shown that the average of the magnitude of differences of the first adjacent samples 70 of FIG. 3B is $$|\overline{v_{e-o}}| = \left|\frac{4V_a}{\pi}\sin\left(\omega_a\left(\frac{1}{2f_s} - \Delta T\right)\right)\right| \quad (5)$$

and the average of the magnitude of differences of the second adjacent samples 72 of FIG. 3B is $$|\overline{v_{o-e}}| = \left|\frac{4V_a}{\pi}\sin\left(\omega_a\left(\frac{1}{2f_s} + \Delta T\right)\right)\right|. \quad (6)$$

These expressions correspond to the first and second sums recited in process 83 of FIG. 4 when differences as substituted for sums as indicated by the substitution arrow 86. From equations (6) and (7), it may be shown that the difference is $$|\overline{v_{o-e}}| - |\overline{v_{e-o}}| = \frac{8V_a}{\pi}\cos\left(\frac{\omega_a}{2f_s}\right)\sin(\omega_a\Delta T). \quad (7)$$

Equations (5), (6) and (7) are shown as plots 152, 153 and 154 in the graph 150 of FIG. 7B in which it is again assumed that the system rate $f_s$ is 1 GHz and that $\Delta T$ is 100 picoseconds.

It is noted that the difference 154 remains positive throughout the first Nyquist zone and remains negative throughout the second Nyquist zone. Because of the cosine function in equation (7), the difference 154 has greater amplitudes than the difference 144 of FIG. 7A in the lower portion of the first Nyquist zone. Accordingly, it may be desirable to use this difference in applications directed to that signal area.

It can be shown that further processing of the difference between magnitudes of first-adjacent-sample sums and interleaved magnitudes of second-adjacent-sample sums can provide the phase error $\Delta T$ (½ of the total phase error between the even samples and the odd samples in equations 1–7) if information is also available concerning input-signal parameters (e.g., input signal amplitude $V_a$ and rate $\omega_a$). This processing may include the first-adjacent-sample sums and second-adjacent-sample sums, the first-adjacent-sample differences and second-adjacent-sample differences, or combinations thereof.

Figure 8:
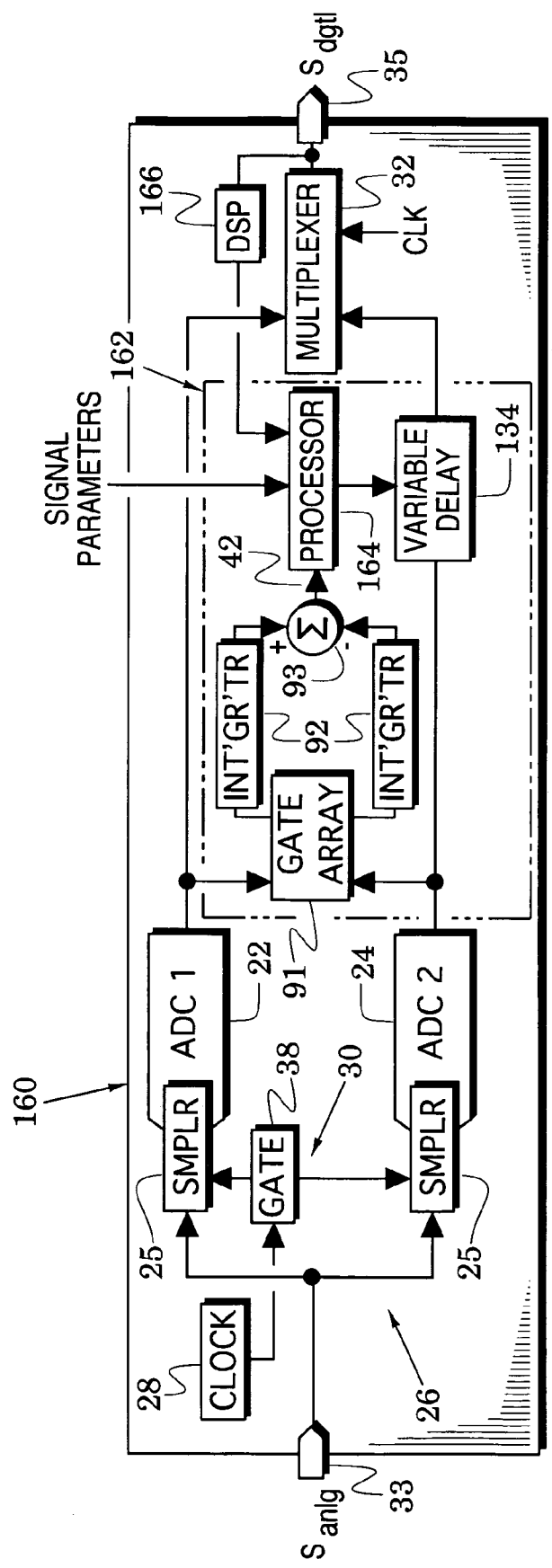
FIG. 8 is a block diagram of another time-interleaved converter system embodiment.

Accordingly, FIG. 8 illustrates a converter system 160 that includes elements of the system 130 of FIG. 2 with like elements indicated by like reference numbers. In this system, the controller 132 is modified to a controller 162 that includes a processor 164 which receives the difference signal 42 and also parameters of the input signal at the input port 33. The processor combines the difference signal and the parameters to obtain the phase error $\Delta T$. The variable delay 134 has been moved downstream so that it can insert the phase error $\Delta T$ in an open-loop arrangement.

In an exemplary processing operation of the processor 164, it may take the differences of equations (3) and (7) and combine them to obtain $$\sqrt{(|\overline{v_{e+o}}| - |\overline{v_{o+e}}|)^2 + (|\overline{v_{o-e}}| - |\overline{v_{e-o}}|)^2} = \quad (8)$$

$$\frac{8V_a}{\pi}\sqrt{\sin\left(\frac{\omega_a}{2f_s}\right)^2 \sin(\omega_a\Delta T)^2 + \cos\left(\frac{\omega_a}{2f_s}\right)^2 \cos(\omega_a\Delta T)^2} =$$

$$\frac{8V_a}{\pi}\sin(\omega_a\Delta T)$$

which it may then combine with known signal parameters (amplitude $V_a$ and rate $\omega_a$) to obtain the phase error $\Delta T$.

Essentially, the processor 164 determines at least one difference between magnitudes of first-adjacent-sample sums and magnitudes of second-adjacent-sample sums, obtains an estimated phase error from this difference and from predetermined parameters of the analog input signal, and temporally shifts the digitized samples of one of said converters by the phase error.

In another converter embodiment of FIG. 8, the signal parameters may be internally provided by a digital signal processor (DSP) 166 that appropriately processes (e.g., by performing a fast Fourier transform (FFT)) the interleaved samples from the multiplexer 32.

The difference signal (42 in FIGS. 1 and 2) illustrations in FIGS. 7A and 7B and 8 have been described with the assumption of a system having two converters. However, applications of the difference signal may be extended to systems having a greater number of converters. Although it can be shown that the sign of the difference signal will remain unchanged only for respective portions of a single Nyquist zone for these systems, the difference signal is still valid for use as long as the analog input signal is restricted to known portions. Alternatively, each of the portions can be identified and the sign of the difference signal changed for those portions that require the change.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of correcting timing errors in analog-to-digital converters of a time-interleaved system that processes an analog input signal, comprising the steps of:
   with each of said converters, generating respective ones of interleaved digitized samples of said analog input signal;
   finding a first sum of magnitudes of first-adjacent-sample sums and a second sum of magnitudes of interleaved second-adjacent-sample sums;
   determining a difference between said first sum and said second sum; and
   temporally shifting the samples of at least one of said converters to reduce said difference.

2. The method of claim 1, wherein:
   said first-adjacent-sample sums each comprise the sum of a sample from a first one of said converters and the successive sample from a second one of said converters; and
   said second-adjacent-sample sums each comprise the sum of a sample from said second converter and the successive sample from said first converter.

3. The method of claim 1, wherein said shifting step includes the step of altering the clocking of a sampler of one of said converters.

4. The method of claim 1, wherein said shifting step includes the step of temporally shifting the digitized samples of one of said converters.

5. A method of correcting timing errors in analog-to-digital converters of a time-interleaved system that processes an analog input signal, comprising the steps of:
   with each of said converters, generating respective ones of interleaved digitized samples of said analog input signal;
   finding a first sum of magnitudes of first-adjacent-sample differences and a second sum of magnitudes of second-adjacent-sample differences;
   determining a difference between said first sum and said second sum; and
   temporally shifting the samples of at least one of said converters to reduce said difference.

6. The method of claim 5, wherein:
   said first-adjacent-sample differences each comprise the difference of a sample from a first one of said converters and the successive sample from a second one of said converters; and
   said second-adjacent-sample differences each comprise the difference of a sample from said second converter and the successive sample from said first converter.

7. The method of claim 5, wherein said shifting step includes the step of temporally shifting the digitized samples of one of said converters.

8. The method of claim 5, wherein said shifting step includes the step of altering the clocking of a sampler of one of said converters.

9. A time-interleaved converter system that processes an analog input signal having predetermined signal parameters, comprising:
   at least two analog-to-digital converters coupled to generate respective ones of interleaved digitized samples of said analog input signal; and
   a controller configured to:
   a) find a first sum of magnitudes of first-adjacent-sample sums and a second sum of magnitudes of interleaved second-adjacent-sample sums; and
   b) determine a difference between said first and second sums; and
   c) vary a delay inserted after one of said converters to reduce said difference;
   wherein said first-adjacent-sample sums each comprise the sum of a sample from a first one of said converters and the successive sample from a second one of said converters; and
   said second-adjacent-sample sums each comprise the sum of a sample from said second converter and the successive sample from said first converter.

10. The system of claim 9, wherein said controller includes:
    delay elements arranged to temporally align digitized samples from said converters;
    adders arranged to form said first-adjacent-sample sums and said interleaved second-adjacent-sample sums in response to samples from said delay elements;
    bit inverters arranged to provide said magnitudes in response to said first-adjacent-sample sums and second-adjacent-sample sums from said adders;
    integrators arranged to provide said first and second sums in response to said magnitudes from said bit inverters; and
    an adder that provides a difference in response to said first and second sums from said integrators; and
    a variable delay that responds to said difference and is inserted after one of said converters.

11. A time-interleaved converter system that processes an analog input signal having predetermined signal parameters, comprising:
    at least two analog-to-digital converters coupled to generate respective ones of interleaved digitized samples of said analog input signal; and
    a controller configured to:
    a) find a first sum of magnitudes of first-adjacent-sample differences and a second sum of magnitudes of interleaved second-adjacent-sample differences; and b) determine a difference between said first and second differences; and c) vary a delay inserted after one of said converters to reduce said difference;

wherein said first-adjacent-sample differences each comprise the difference of a sample from a first one of said converters and the successive sample from a second one of said converters; and said second-adjacent-sample differences each comprise the difference of a sample from said second converter and the successive sample from said first converter.

12. The system of claim 11, wherein said controller includes:

delay elements arranged to temporally align digitized samples from said converters;

adders arranged to form said first-adjacent-sample differences and said interleaved second-adjacent-sample differences in response to samples from said delay elements;

bit inverters arranged to provide said magnitudes in response to said first-adjacent-sample differences and second-adjacent-sample differences from said adders;

integrators arranged to provide said first and second sums in response to said magnitudes from said bit inverters; and an adder that provides a difference in response to said first and second sums from said integrators; and a variable delay that responds to said difference and is inserted after one of said converters.

13. A time-interleaved converter system that processes an analog input signal having predetermined signal parameters, comprising:

at least two analog-to-digital converters coupled to generate respective ones of interleaved digitized samples of said analog input signal; and a controller configured to:

a) find a first sum of magnitudes of first-adjacent-sample sums and a second sum of magnitudes of interleaved second-adjacent-sample sums; and b) determine a difference between said first and second sums; and c) temporally shift the samples of one of said converters to reduce said difference;

wherein said first-adjacent-sample sums each comprise the sum of a sample from a first one of said converters and the successive sample from a second one of said converters; and said second-adjacent-sample sums each comprise the sum of a sample from said second converter and the successive sample from said first converter.

14. The system of claim 13, wherein said controller includes:

delay elements arranged to temporally align digitized samples from said converters;

adders arranged to form said first-adjacent-sample sums and said interleaved second-adjacent-sample sums in response to samples from said delay elements;

bit inverters arranged to provide said magnitudes in response to said first-adjacent-sample sums and second-adjacent-sample sums from said adders;

integrators arranged to provide said first and second sums in response to said magnitudes from said bit inverters; and an adder that provides a difference in response to said first and second sums from said integrators; and a variable sampler in one of said converters that responds to said difference.

15. A time-interleaved converter system that processes an analog input signal having predetermined signal parameters, comprising:

at least two analog-to-digital converters coupled to generate respective ones of interleaved digitized samples of said analog input signal; and a controller configured to:

a) find a first sum of magnitudes of first-adjacent-sample differences and a second sum of magnitudes of interleaved second-adjacent-sample differences; and b) determine a difference between said first and second differences; and c) temporally shift the samples of one of said converters to reduce said difference;

wherein said first-adjacent-sample differences each comprise the difference of a sample from a first one of said converters and the successive sample from a second one of said converters; and said second-adjacent-sample differences each comprise the difference of a sample from said second converter and the successive sample from said first converter.

16. The system of claim 15, wherein said controller includes:

delay elements arranged to temporally align digitized samples from said converters;

adders arranged to form said first-adjacent-sample differences and said interleaved second-adjacent-sample differences in response to samples from said delay elements;

bit inverters arranged to provide said magnitudes in response to said first-adjacent-sample differences and second-adjacent-sample differences from said adders;

integrators arranged to provide said first and second sums in response to said magnitudes from said bit inverters; and an adder that provides a difference in response to said first and second sums from said integrators; and a variable sampler in one of said converters that responds to said difference.

* * * * *